United States Patent
Yokoyama et al.

(10) Patent No.: US 9,711,208 B2
(45) Date of Patent: Jul. 18, 2017

(54) SEMICONDUCTOR STORAGE DEVICE WITH REDUCED CURRENT IN STANDBY MODE

(71) Applicant: Renesas Electronics Corporation, Tokyo (JP)

(72) Inventors: Yoshisato Yokoyama, Tokyo (JP); Yuichiro Ishii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/878,049

(22) Filed: Oct. 8, 2015

(65) Prior Publication Data

US 2016/0125932 A1    May 5, 2016

(30) Foreign Application Priority Data

Oct. 31, 2014  (JP) .................................. 2014-223183

(51) Int. Cl.
G11C 11/417    (2006.01)
G11C 5/14    (2006.01)

(52) U.S. Cl.
CPC ............ G11C 11/417 (2013.01); G11C 5/148 (2013.01)

(58) Field of Classification Search
CPC .............................. G11C 11/417; G11C 5/148
(Continued)

(56) References Cited

U.S. PATENT DOCUMENTS 4,764,897 A * 8/1988 Kameyama ........... G11C 11/418
327/208
5,734,604 A * 3/1998 Akamatsu ............. G11C 11/417
365/156
(Continued)

FOREIGN PATENT DOCUMENTS

EP    1 962 290 A1    8/2008
JP    2004-206745 A    7/2004
(Continued)

OTHER PUBLICATIONS

Silva et al., Power Efficient Variability Compensation Through Clustered Tunable Power-Gating, Sep. 2011, IEEE in Circuit and Systems, vol. 1, No. 3.*

(Continued)

*Primary Examiner* — Vu Le
*Assistant Examiner* — Sung Cho
(74) *Attorney, Agent, or Firm* — McGinn IP Law Group, PLLC

(57) ABSTRACT

There is provided a semiconductor storage device in which memory cells can easily be set at a proper potential in standby mode, along with a reduction in the area of circuitry for controlling the potential of source lines of memory cells. A semiconductor storage device includes static-type memory cells and a control circuit. The control circuit includes a first switching transistor provided between a source line being coupled to a source electrode of driving transistors and a first voltage, a second switching transistor provided in parallel with the first switching transistor, and a source line potential control circuit which makes the first and second switching transistors conductive to couple the source line to the first voltage, when the memory cells are operating, and sets the first switching transistor non-con- (Continued)

ductive and sets a gate electrode of the second switching transistor coupled to the source line in standby mode.

8 Claims, 11 Drawing Sheets

(58) Field of Classification Search
USPC ...... 365/154, 189.05, 189.16, 190, 226, 228
See application file for complete search history.

(56) References Cited

U.S. PATENT DOCUMENTS

| | | | | |
|---|---|---|---|---|
| 5,986,923 A * | 11/1999 | Zhang | ............... | G11C 11/412 365/154 |
| 6,549,453 B2 * | 4/2003 | Wong | ............... | G11C 11/412 365/154 |
| 6,560,139 B2 * | 5/2003 | Ma | ............... | G11C 11/412 365/154 |
| 6,603,345 B2 * | 8/2003 | Takahashi | ............... | G05F 3/247 327/534 |
| 6,657,911 B2 * | 12/2003 | Yamaoka | ............... | G11C 5/146 365/226 |
| 6,999,338 B1 * | 2/2006 | Hirabayashi | ............... | G11C 11/417 365/154 |
| 7,020,041 B2 * | 3/2006 | Somasekhar | ............... | G11C 5/143 365/189.06 |
| 7,061,820 B2 * | 6/2006 | Deng | ............... | G11C 11/417 365/189.09 |
| 7,110,317 B2 * | 9/2006 | Song | ............... | G11C 11/417 365/154 |
| 7,200,030 B2 * | 4/2007 | Yamaoka | ............... | G11C 11/417 365/154 |
| 7,242,600 B2 * | 7/2007 | Phan | ............... | G11C 8/12 365/203 |
| 7,254,085 B2 * | 8/2007 | Hirabayashi | ............... | G11C 11/417 365/154 |
| 7,269,055 B2 * | 9/2007 | Lin | ............... | G11C 11/417 365/154 |
| 7,362,646 B2 * | 4/2008 | Otsuka | ............... | G11C 11/417 365/185.24 |
| 7,423,916 B2 * | 9/2008 | Nii | ............... | G11C 5/14 365/154 |
| 7,616,516 B2 * | 11/2009 | Hirayama | ............... | G11C 11/412 365/154 |
| 7,623,405 B2 * | 11/2009 | Lysinger | ............... | G11C 5/143 365/154 |
| 7,688,669 B2 * | 3/2010 | McClure | ............... | G11C 5/147 365/189.09 |
| 7,701,755 B2 * | 4/2010 | Chen | ............... | G11C 11/412 365/154 |
| 8,218,376 B2 * | 7/2012 | Seshadri | ............... | G11C 5/147 365/154 |
| 8,319,548 B2 * | 11/2012 | Ramaraju | ............... | G05F 1/56 327/540 |
| 8,400,819 B2 * | 3/2013 | Russell | ............... | G11C 7/02 365/154 |
| 8,527,625 B2 * | 9/2013 | Dolbier | ............... | A63F 13/12 709/224 |
| 9,165,641 B2 * | 10/2015 | Gulati | ............... | G11C 11/417 |
| 9,378,805 B2 * | 6/2016 | Walsh | ............... | G11C 11/417 |
| 9,412,422 B2 * | 8/2016 | Huber | ............... | G11C 5/14 |
| 2004/0125681 A1 | 7/2004 | Yamaoka et al. | | |
| 2005/0094474 A1 * | 5/2005 | Deng | ............... | G11C 5/14 365/229 |
| 2007/0047364 A1 * | 3/2007 | Chuang | ............... | G11C 5/147 365/226 |
| 2007/0121358 A1 | 5/2007 | Hirota et al. | | |
| 2009/0189636 A1 * | 7/2009 | Amedeo | ............... | H03K 19/0016 326/33 |
| 2010/0208539 A1 | 8/2010 | Leomant et al. | | |
| 2010/0214863 A1 * | 8/2010 | Chan | ............... | G11C 5/147 365/228 |
| 2010/0322016 A1 * | 12/2010 | Kumar | ............... | G11C 7/02 365/189.07 |
| 2012/0013319 A1 * | 1/2012 | Patil | ............... | G11C 5/148 323/282 |
| 2012/0147688 A1 * | 6/2012 | Chen | ............... | G11C 11/413 365/229 |

FOREIGN PATENT DOCUMENTS

JP 2007-150761 A 6/2007
WO WO 2007/048232 A1 5/2007

OTHER PUBLICATIONS

Extended European Search Report dated Mar. 17, 2016.
European Office Action dated Apr. 18, 2017.

* cited by examiner

SEMICONDUCTOR STORAGE DEVICE WITH REDUCED CURRENT IN STANDBY MODE

CROSS-REFERENCE TO RELATED APPLICATIONS

The disclosure of Japanese Patent Application No. 2014-223183 filed on Oct. 31, 2014 including the specification, drawings, and abstract is incorporated herein by reference in its entirety.

BACKGROUND

The present disclosure relates to a semiconductor storage device and its configurations for reducing current in standby mode.

Reducing current in standby mode of a Static Random Access Memory (SRAM) has so far been pursued. Circuits are proposed which are configured to reduce current by controlling the potential of source lines and lowering voltage that is applied to memory cells in standby mode in which the memory cells only retains data, but reading and writing data from/to them are not performed, apart from normal mode in which reading and writing data from/to the memory cells are performed.

In this respect, according to Japanese Published Unexamined Patent Application No. 2004-206745, a transistor serving as a power supply switch which is coupled to source lines of memory cells and a diode-coupled transistor are separately provided. The transistor serving as the power supply switch is controlled to be conducting in normal mode and non-conducting in standby mode, when the potential of source lines of memory cells is controlled by the diode-coupled transistor.

In a configuration according to Japanese Published Unexamined Patent Application No. 2007-150761, a single diode-coupled transistor is only provided and there is no transistor serving as a power supply switch which is coupled to source lines of memory cells. This transistor is conducting in normal mode to bring down the potential of source lines. In standby mode, the transistor will be diode-coupled with its gate set equal to the source potential of memory cells and controls the potential of source lines of memory cells.

SUMMARY

However, the configuration proposed in Japanese Published Unexamined Patent Application No. 2004-206745 requires a large area, since the transistor serving as the power supply switch and the diode-coupled transistor for raising the source lines of the memory cells are made to operate independently of each other and an area must be provided for each transistor.

In the configuration proposed in Japanese Published Unexamined Patent Application No. 2007-150761, a single transistor is only used and, therefore, area shrinkage is feasible. But, in a case where a diode-coupled transistor is used to control the potential of source lines of memory cells, it is required to design the transistor to be small in size to reduce current in standby mode. There is a problem in which such transistor size is too small to bring the potential of source lines of memory cells down to ground potential in normal mode. Therefore, there is a problem in which it is hard to fulfill both functions with a single transistor and proper sizing of the transistor is quite difficult.

The invention disclosed herein has been developed to solve the above problem and aims to provide a semiconductor storage device in which memory cells can easily be set at a proper potential to retain data without corruption and reduce a leak current in standby mode, along with a reduction in the area of circuitry for controlling the potential of source lines of memory cells.

Other problems and novel features will become apparent from the description in the present specification and the accompanying drawings.

According to one embodiment, a semiconductor storage device includes a memory array including multiple memory cells provided in rows and columns and a control circuit for controlling the memory array. Each of the memory cells is a static-type memory cell comprised of driving transistors, transfer transistors, and load elements. The control circuit includes a first switching transistor provided between a source line and a first voltage, the source line being coupled to a source electrode of the driving transistors, a second switching transistor provided in parallel with the first switching transistor between the source line and the first voltage, and a source line potential control circuit that adjusts the potential of the source line by controlling the first and second switching transistors. The source line potential control circuit makes the first and second switching transistors conductive to couple the source line to the first voltage, when the memory cells are operating, and sets the first switching transistor non-conductive and sets a gate electrode of the second switching transistor coupled to the source line, when the memory cells are in standby mode.

According to one embodiment, it is possible to easily set the memory cells at a proper potential to retain data without corruption and reduce a leak current in standby mode, along with a reduction in the area of circuitry for controlling the potential of source lines of memory cells.

DETAILED DESCRIPTION

Figure 1:
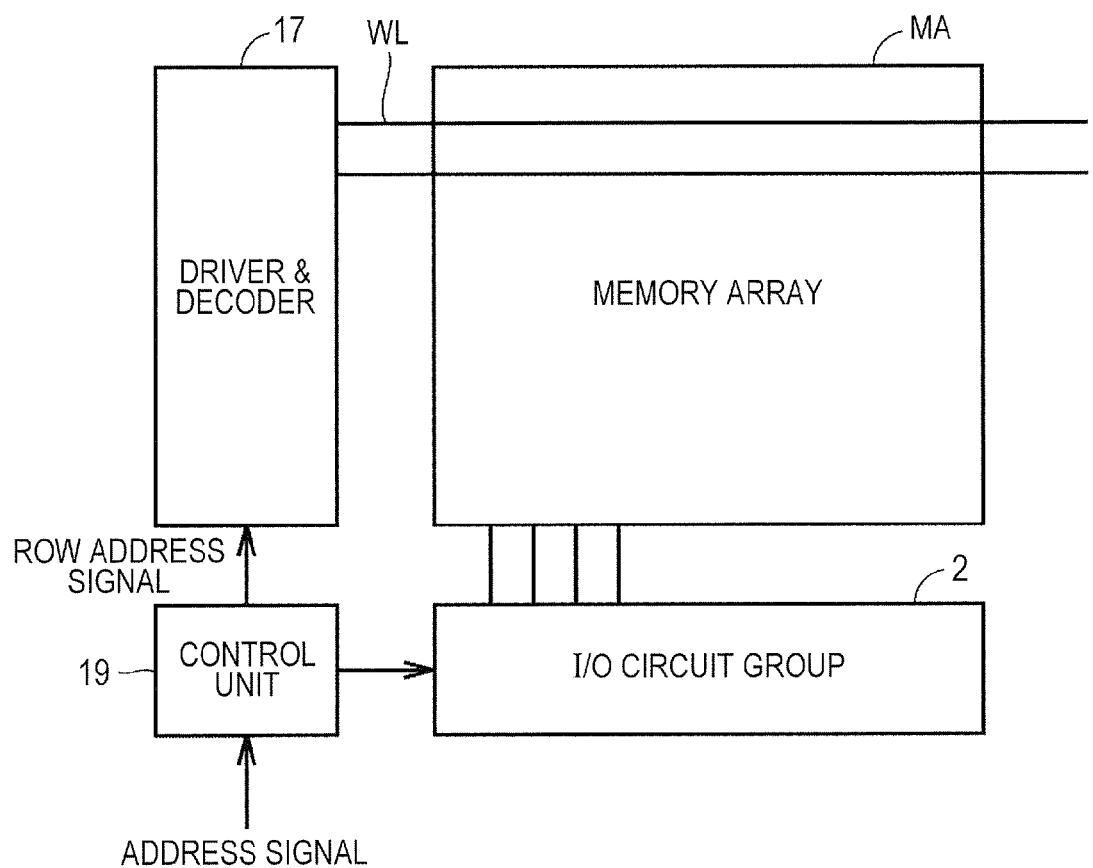
FIG. 1 is an outside structure diagram of a semiconductor storage device based on an embodiment.

Embodiments of the present invention will now be described in detail with reference to the drawings. In the drawings, identical or corresponding components are assigned the same referential numbers or marks and their description is not repeated.

FIG. 1 is an outside structure diagram of a semiconductor storage device based on an embodiment.

As depicted in FIG. 1, the semiconductor storage device includes a driver & decoder 17, a memory array MA, a control unit 19, and an I/O circuit group 2. A decoder is a simplified term of an address decoder.

The control unit 19 controls all functional blocks of the semiconductor storage device. Particularly, the control unit 19 outputs a row address signal to the driver & decoder 17, based on an address signal which has been input to it. The control unit 19 also outputs various signals to drive the I/O circuit group 2.

The memory array MA has multiple memory cells arranged in rows and columns. The memory cells in the memory array MA are provided to be rewritable.

The driver & decoder 17 drives word lines WL provided to correspond respectively to the rows of the memory cells arranged in rows and columns in the memory array MA.

The I/O circuit group 2 is comprised of plural I/O circuits which are provided as input/output circuits for reading data from or writing data to the memory array MA.

Figure 2:
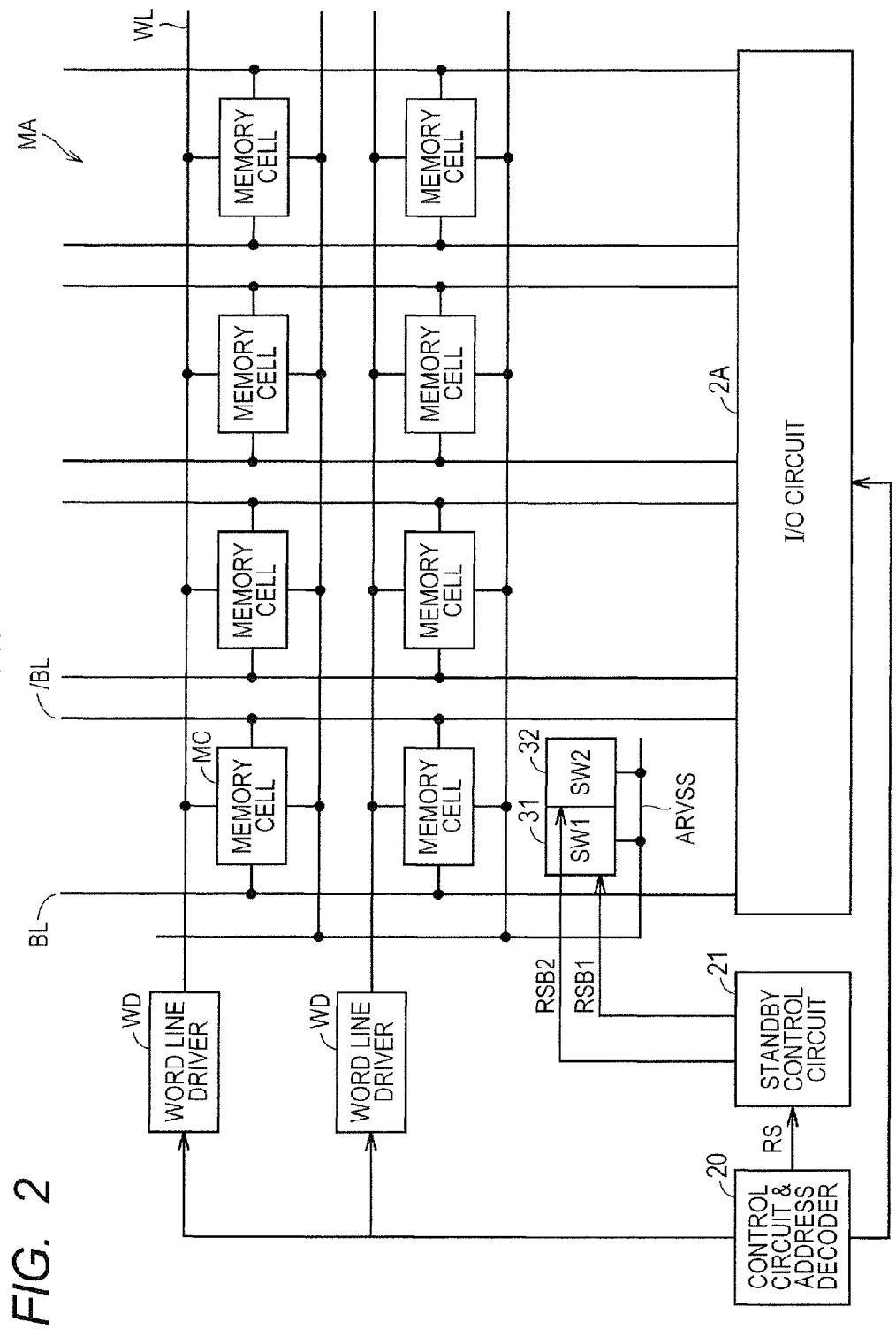
FIG. 2 is a diagram to explain a configuration of a memory array MA and peripheral circuits based on an embodiment.

FIG. 2 is a diagram to explain a configuration of the memory array MA and peripheral circuits based on an embodiment.

As depicted in FIG. 2, in the present example, descriptions are provided about a configuration of the memory array and a source line potential control circuit or the like which adjusts the potential of source lines provided in the memory array.

The memory array MA has multiple memory cells MC arranged in rows and columns. Each memory cell MC is an SRAM (Static Random Access Memory) cell provided to be rewritable. Each memory cell MC is a static-type memory cell configured with driving transistors, transfer transistors, and load elements, which will be described later.

In the present example, memory cells MC arranged in two rows and four columns are depicted by way of example.

Multiple word lines WL are provided to correspond respectively to the rows of the memory cells in the memory array MA.

The driver & decoder 17 includes word line drivers WD which are provided to correspond to the word lines WL.

The control unit 19 includes various control circuits; in the present example, it includes a control circuit & address decoder 20 and a standby control circuit 21.

The control circuit & address decoder 20 controls operation in normal mode and in standby mode and outputs a row address signal, which is a result of decoding an address signal by the address decoder, to a word line driver WD.

A word line driver WD activates a word line WL selected according to a row address signal.

According to a control signal RS from the control circuit & address decoder 20, the standby control circuit 21 outputs control signals RSB1, RSB2 and adjusts the potential of a source line.

Multiple bit line pairs BL, /BL are provided to correspond respectively to the columns of the memory cells in the memory array MA. In the present example, four bit line pairs are provided to correspond to four columns of memory cells.

An I/O circuit 2A includes, inter alia, selection circuits which are provided for each of the four columns of memory cells arranged in rows and columns to select one of the four columns, and a sense amplifier, a write driver, and bit line precharging circuits.

The source electrodes of all the memory cells MC are coupled to a source line ARVSS and plural switching transistors are provided coupled to the source line ARVSS.

In the present example, plural switching transistors are provided between the source line ARVSS and a ground voltage VSS. When the memory cells MC are operating, the source line ARVSS is coupled to the ground voltage. When the memory cells are in standby mode, a subset of the switching transistors behaves to couple a gate electrode thereof to the source line ARVSS and the remaining subset of the switching transistors is set non-conductive.

In the present example, a first switching transistor 31 and a second switching transistor 32 are provided.

The first switching transistor 31 and the second switching transistor 32 are provided to be coupled in parallel.

Figure 3:
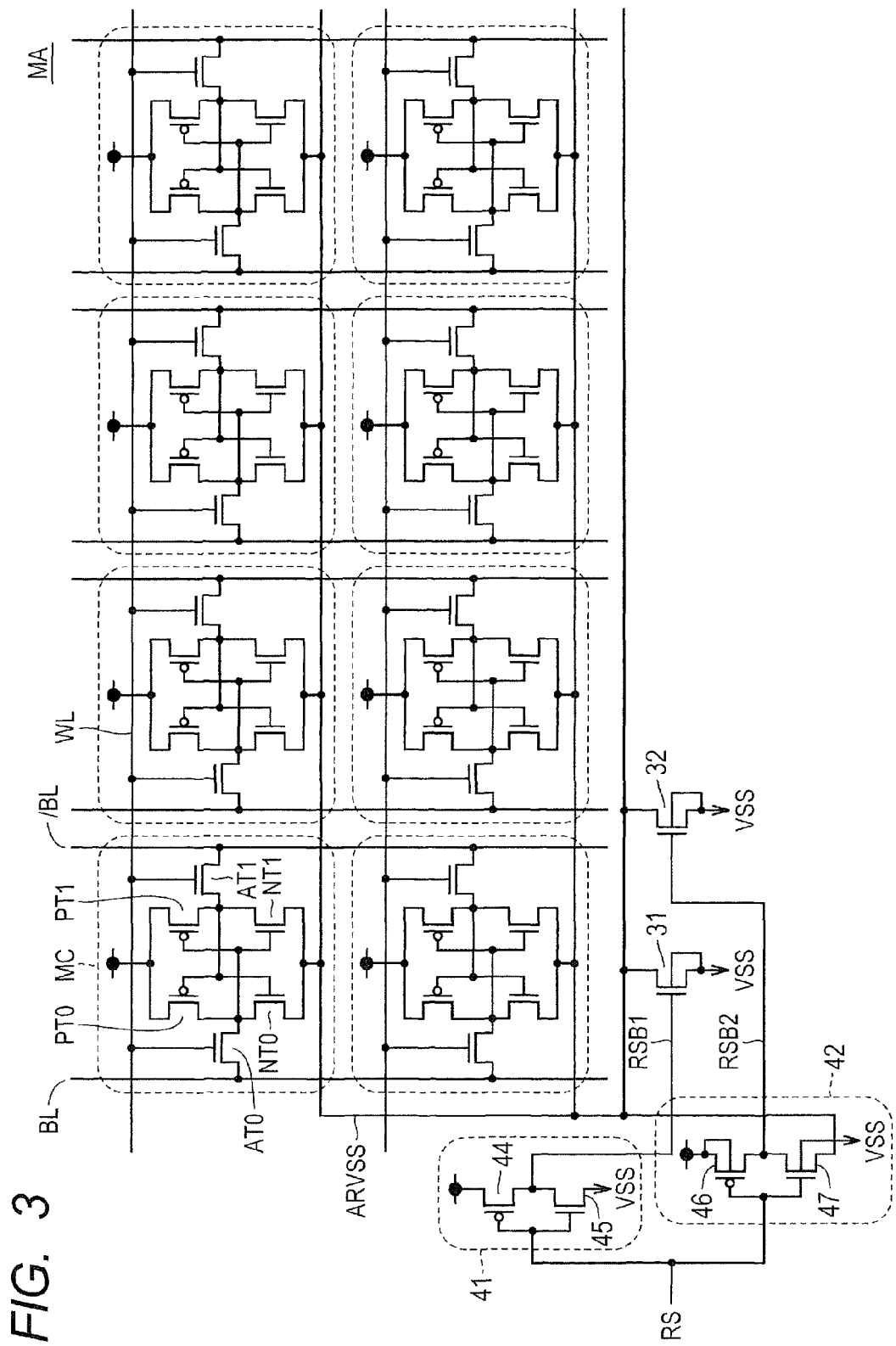
FIG. 3 is a diagram to explain a configuration of a source line potential control circuit based on an embodiment.

FIG. 3 is a diagram to explain a configuration of a source line potential control circuit based on an embodiment.

As depicted in FIG. 3, the source line potential control circuit includes the standby control circuit 21 and first and second switching transistors 31, 32.

The configuration of the memory cells MC is also depicted in FIG. 3. Each of the memory cells depicted here is an SRAM cell comprised of six transistors including two access transistors AT0, AT1 (transfer transistors), driving transistors NT0, NT1, and load transistors PT0, PT1 (load elements).

The access transistors AT0, AT1 in a memory cell are electrically coupled to a word line WL corresponding to a row in which the memory cell is located. The access transistors AT0, AT1 become conductive upon activation of the word line when reading data from or writing data to the memory cell MC.

The standby control circuit 21 includes drivers 41, 42.

The drivers 41, 42 are configured as an inverter. A driver 41 includes a P-channel MOS transistor 44 and an N-channel MOS transistor 45. A driver 42 includes a P-channel MOS transistor 46 and an N-channel MOS transistor 47.

The P-channel MOS transistor 44 and N-channel MOS transistor 45 are provided between a power supply voltage VDD and the ground voltage VSS and their gates receive a control signal RS as an input. And, an output of the driver 41 is input to a gate of the first switching transistor 31 as a control signal RSB1.

The P-channel MOS transistor 46 and N-channel MOS transistor 47 are provided between the power supply voltage VDD and the source line ARVSS and their gates receive a control signal RS as an input. And, an output of the driver 42 is input to a gate of the second switching transistor 32 as a control signal RSB2.

The first switching transistor 31 is provided between the source line ARVSS and the ground voltage VSS and its gate receives the control signal RSB1 as an input.

The second switching transistor 32 is provided between the source line ARVSS and the ground voltage VSS and its gate receives the control signal RSB2 as an input.

Figure 4:
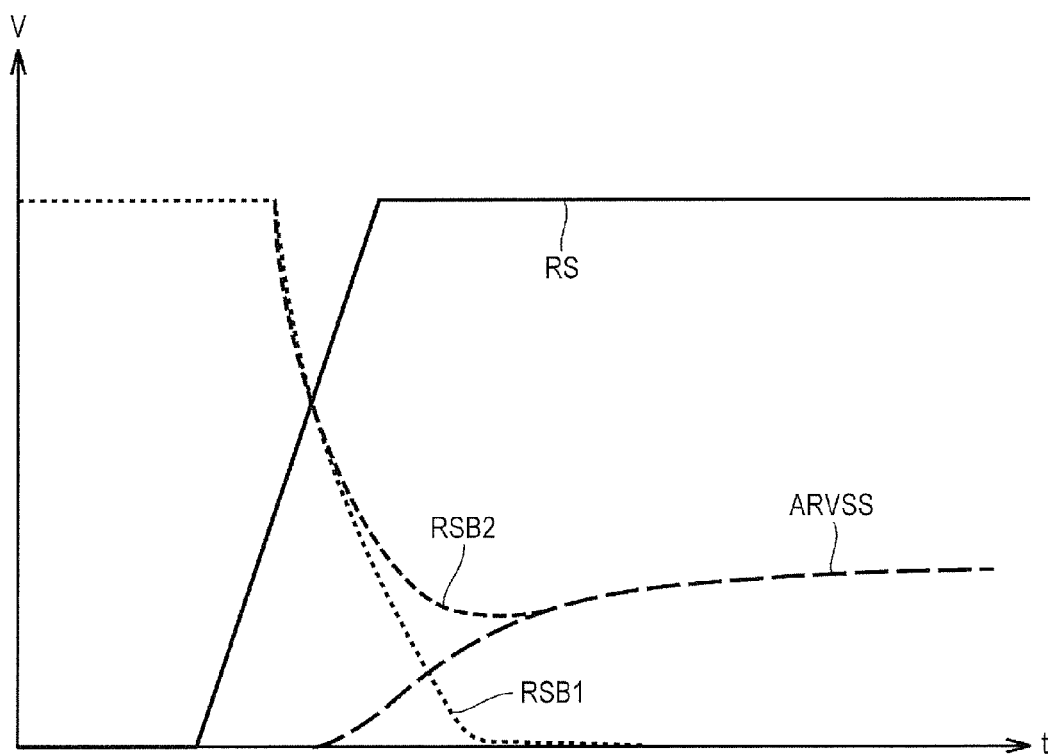
FIG. 4 is a diagram to explain the potential levels of signals in standby mode based on an embodiment.

FIG. 4 is a diagram to explain the potential levels of signals in standby mode based on an embodiment.

Descriptions are provided about operation upon rise of the control signal RS from "L" level to "H" level, as represented in FIG. 4, namely, standby mode operation.

The control circuit & address decoder 20 sets the control signal RS at "L" level in normal mode and sets the RS signal at "H" level in standby mode.

The drivers 41, 42 set the control signals RSB1, RSB2 depending on the control signal RS. Particularly, when the control signal RS is "L" level, the P-channel MOS transistors 44 and 46 become conductive to set both the control signals RSB1, RSB2 at "H" level.

Thereby, the gates of the first and second switching transistors 31, 32 are set to a potential of "H" level and, thus, the first and second switching transistors 31, 32 become conductive. It follows that the source line ARVSS is electrically coupled to the ground voltage VSS.

When the control signal RS is "H" level, the N-channel MOS transistor 45 becomes conductive. Thereby, the control signal RSB1 is set at "L" level and the gate of the first switching transistor 31 is set to a potential of "L" level. It follows that the source line ARVSS is electrically decoupled from the ground voltage VSS.

When the control signal RS is "H" level, the N-channel MOS transistor 47 also becomes conductive. Thereby, the gate of the second switching transistor 32 is electrically coupled to the source line ARVSS. It follows that the control signal RSB2 is set at the same potential level as the source line ARVSS.

In this regard, the potential of the source line ARVSS is balanced by a leak current from the memory cells MC and a passing current through the diode-coupled second switching transistor 32 and set at an intermediate potential between the power supply voltage VDD and the ground voltage VSS. A potential difference between the power supply voltage VDD and the intermediate potential is set to a voltage higher than a voltage that allows the memory cells MC to retain data.

Because the source line ARVSS based on the present embodiment is set at an intermediate potential in standby mode by the source line potential control circuit, it is possible to reduce a leak current. In this regard, the intermediate potential can easily be adjusted by adjusting the size of the second switching transistor 32, such as its gate length and width and the number of switching transistors.

In normal mode, the second switching transistor 32 becomes conductive and the first switching transistor 31 also becomes conductive, thus bringing the potential of the source line ARVSS down to the ground voltage VSS. Because the first and the second switching transistors 31 and 32 become conductive in this way, it is not necessary to increase the size of the first switching transistor 31 and it is possible to reduce the area for these transistors. In standby mode, the first switching transistor 31 becomes non-conductive and the second switching transistor 32 only will be diode-coupled. Therefore, the source potential of the source line ARVSS can be adjusted by adjusting the size of only the second switching transistor 32.

In the present example, the configuration has been described in which the first and second transistors 31, 32, each of which is at least one in number, by way of example, are provided coupled to the source line ARVSS. This is non-limiting, however, and a configuration maybe adopted in which the first and second switching transistors 31 and 32 which are plural in number are provided to adjust the potential of the source line ARVSS.

MODIFICATION EXAMPLE 1

Figure 5:
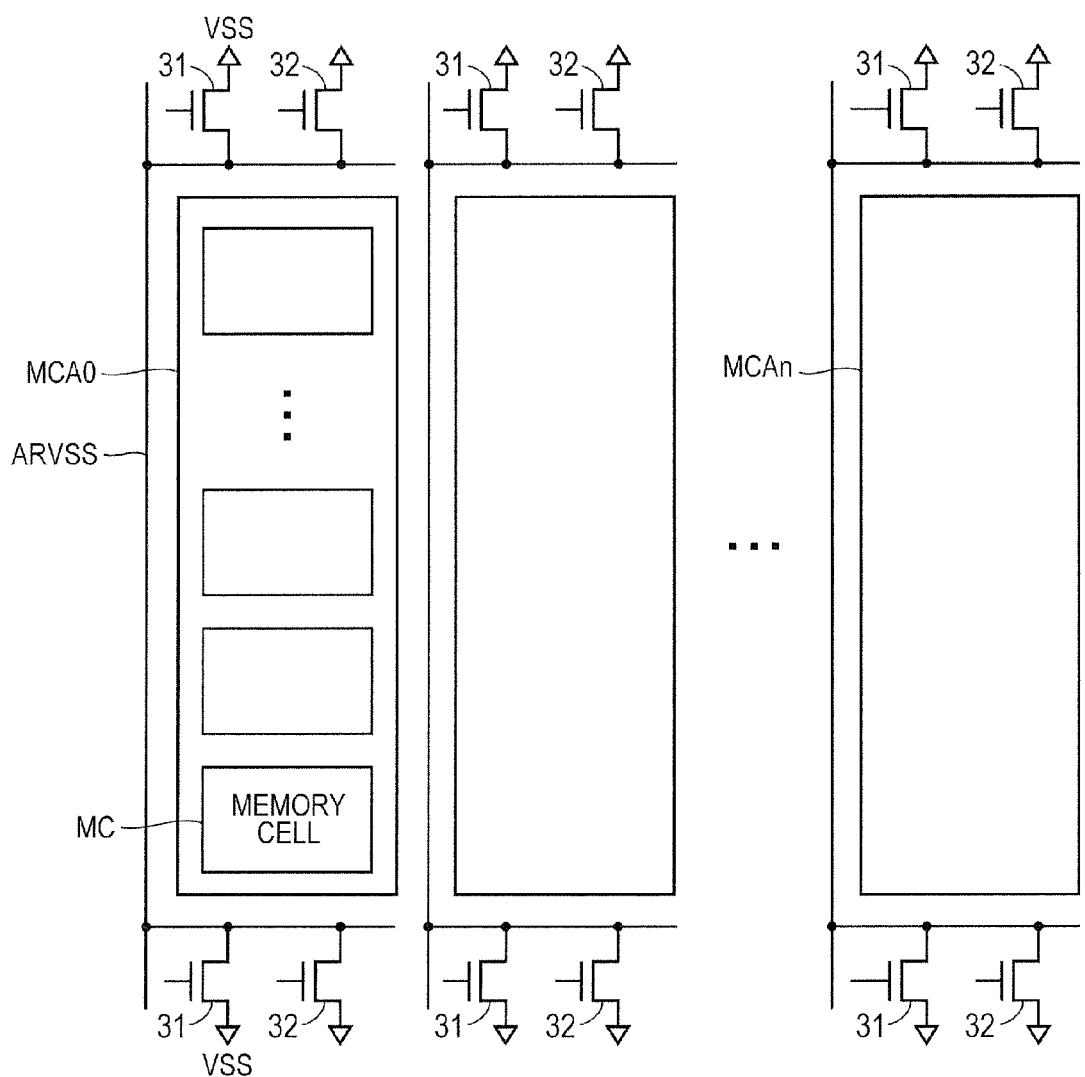
FIG. 5 is a diagram to explain switching transistors based on Modification Example 1 of an embodiment.

FIG. 5 is a diagram to explain switching transistors based on Modification Example 1 of an embodiment.

As depicted in FIG. 5, Modification Example 1 is a configuration in which switching transistors are arranged at the upper and lower end sides of columns of the memory array MA.

Particularly, a configuration is depicted in which the memory array is divided into subdivisions, each subdivision being at least one column of memory cells. In this configuration, source lines are provided for each subdivision column of memory cells and first and second switching transistors 31, 32 are provided coupled to each of the source lines at one end side and the other end side of each column. In the present example, subdivision columns of memory cells MCA0 to MCAn are depicted.

In the present example, descriptions are provided about the case in which the memory array is divided into subdivisions, each subdivision being one column of memory cells. This is non-limiting, however, and the memory array may be divided into subdivisions, each subdivision being two or more columns of memory cells.

This configuration makes it possible to discharge each source line from its one end and both ends.

If switching transistors are provided coupled to a source line only at its one end, it takes some time to bring the potential of the source line ARVSS in a section far from the switching transistors down to the ground voltage VSS. By bringing down the potential of the source line ARVSS from its both ends, a difference in time to discharge charge accumulated on the source line ARVSS can be lessened and it becomes easier to design timing to trigger the memory cells MC to operate.

Because columns of memory cells are arranged iteratively in uniform units, it is possible to keep the potential of the source lines ARVSS constant independently of the number of columns of memory cells.

Figure 6:
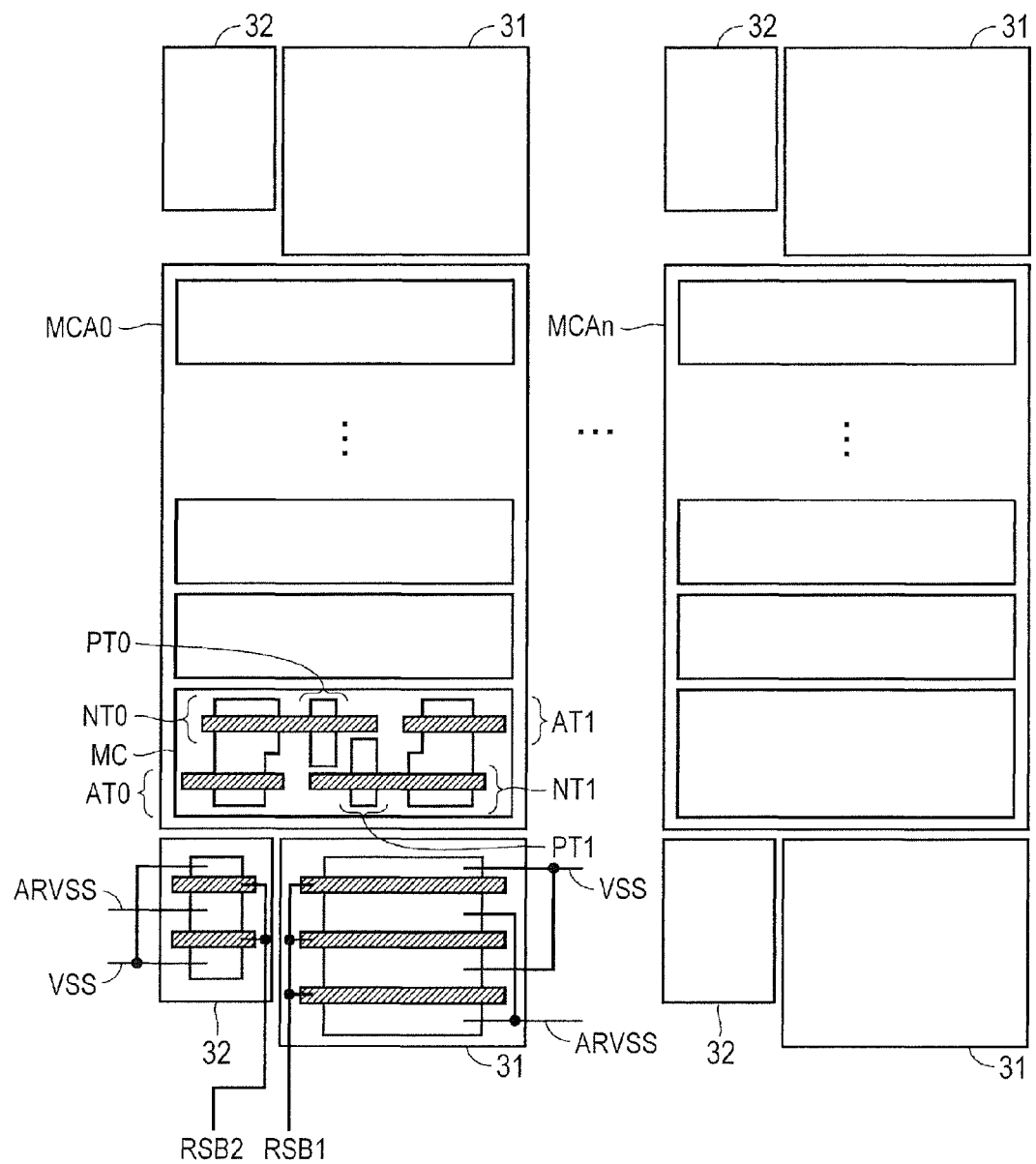
FIG. 6 is a diagram to explain a memory array layout configuration based on Modification Example 1 of an embodiment

FIG. 6 is a diagram to explain a memory array layout configuration based on Modification Example 1 of an embodiment.

As depicted in FIG. 6, a memory array layout configuration in which switching transistors are laid out at one end side and the other end side of each column is depicted.

As a layout in a memory cell MC, depicted here is a layout in an SRAM cell comprised of six transistors including access transistors AT0, AT1 (transfer transistors), driving transistors NT0, NT1, and load transistors PT0, PT1 (load elements).

First and second switching transistors 31, 32 are provided adjacent to the memory cell MC.

A first switching transistor 31 is depicted in which three transistor elements are coupled in parallel with each other; these transistor elements receive at their gate electrodes a control signal RSB1 as an input and their source electrodes are coupled to a ground voltage VSS and their drain electrodes are coupled to a source line ARVSS.

A second switching transistor 32 is depicted in which two transistor elements are coupled in parallel with each other; these transistor elements receive at their gate electrodes a control signal RSB2 as an input and their source electrodes are coupled to the ground voltage VSS and their drain electrodes are coupled to the source line ARVSS.

In the configuration as depicted here, the layout area for the first switching transistor 31 is larger than that for the second switching transistor 32.

MODIFICATION EXAMPLE 2

Figure 7:
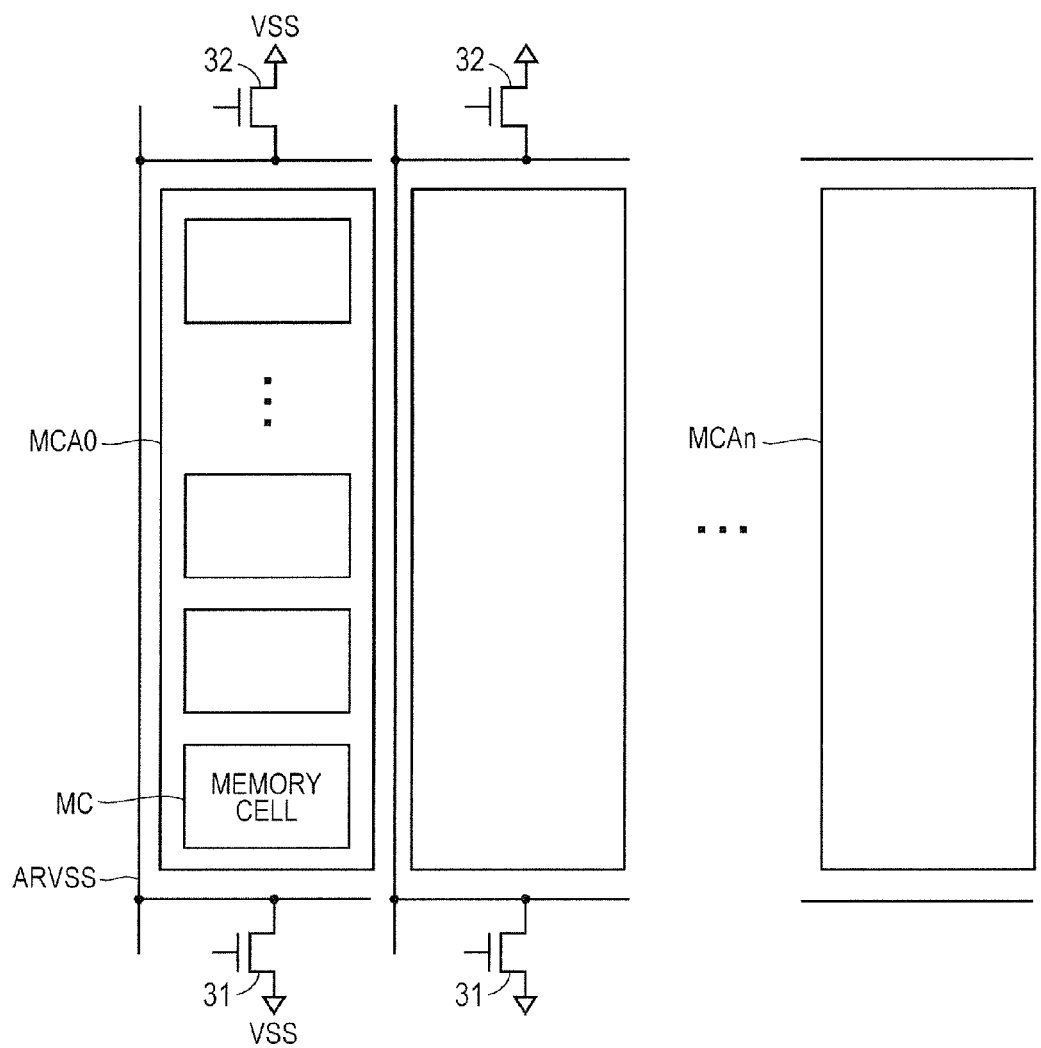
FIG. 7 is a diagram to explain switching transistors based on Modification Example 2 of an embodiment.

FIG. 7 is a diagram to explain switching transistors based on Modification Example 2 of an embodiment.

As depicted in FIG. 7, Modification Example 2 is a configuration in which switching transistors are arranged at the upper and lower end sides of columns of the memory array MA.

Particularly, a configuration is depicted in which the memory array is divided into subdivisions, each subdivision being at least one column of memory cells. In this configuration, source lines are provided for each subdivision column of memory cells, first switching transistors 31 are provided coupled to each of the source lines at one end side of each column, and second switching transistor 32 are provided coupled to each of the source lines at the other end side of each column.

This configuration makes it possible to discharge each source line from its one end and other end.

If switching transistors are provided coupled to a source line only at its one end, it takes some time to bring the potential of the source line ARVSS in a section far from the switching transistors down to the ground voltage VSS. By bringing down the potential of the source line ARVSS from its both ends, a difference in time to discharge charge accumulated on the source line ARVSS can be lessened and it becomes easier to design timing to trigger the memory cells MC to operate.

Because columns of memory cells are arranged iteratively in uniform units, it is possible to keep the potential of the source lines ARVSS constant independently of the number of columns of memory cells.

Figure 8:
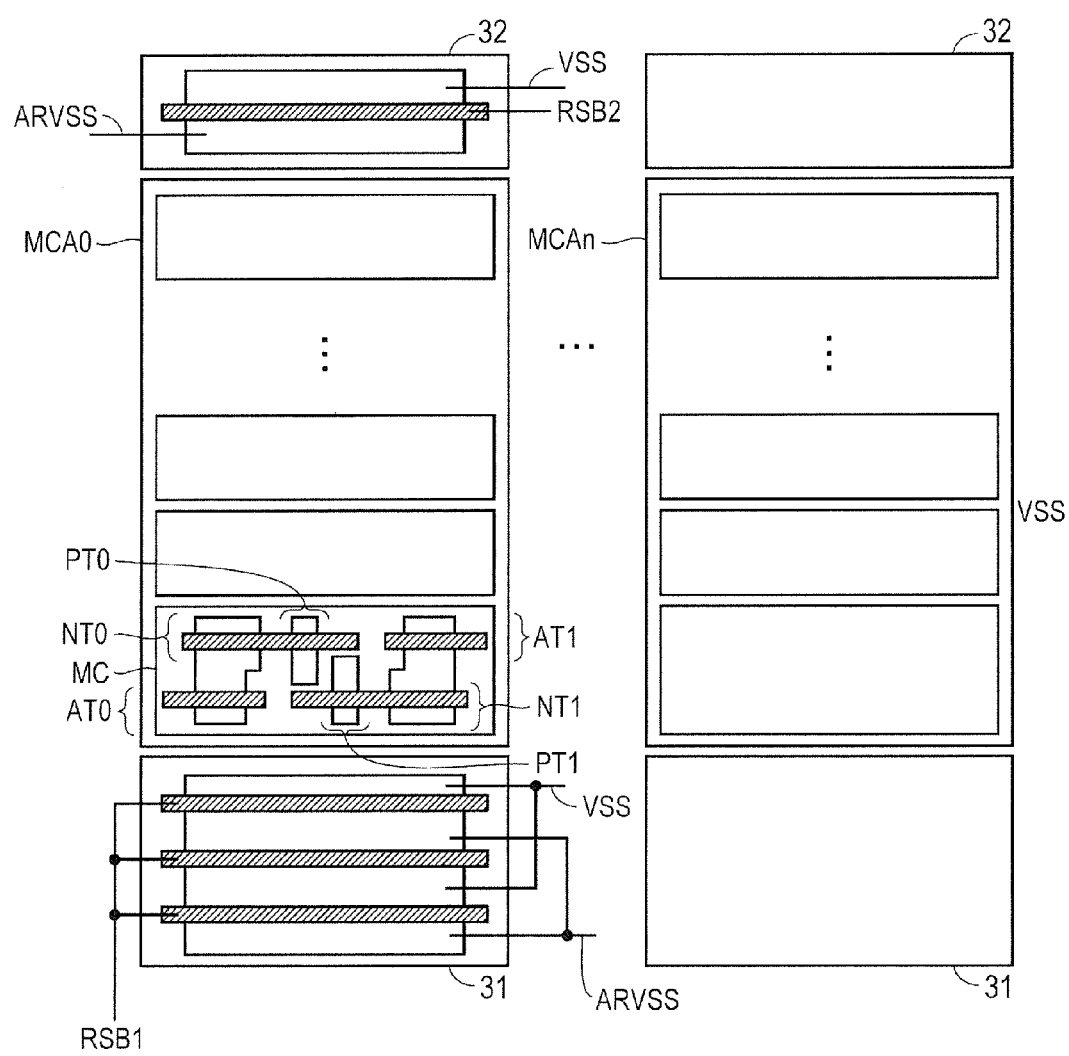
FIG. 8 is a diagram to explain a memory array layout configuration based on Modification Example 2 of an embodiment.

FIG. 8 is a diagram to explain a memory array layout configuration based on Modification Example 2 of an embodiment.

As depicted in FIG. 8, a memory array layout configuration in which switching transistors are laid out at one end side and the other end side of each column is depicted.

A first switching transistor 31 is provided adjacent to a memory cell MC at one end side of each column and a second switching transistor 32 is provided at the other end side of the column.

A first switching transistor 31 is depicted in which three transistor elements are coupled in parallel with each other; these transistor elements receive at their gate electrodes a control signal RSB1 as an input and their source electrodes are coupled to a ground voltage VSS and their drain electrodes are coupled to a source line ARVSS.

A second switching transistor 32 is depicted in which a single transistor element is provided; the transistor element receives at its gate electrode a control signal RSB2 as an input and its source electrode is coupled to the ground voltage VSS and its drain electrode is coupled to the source line ARVSS.

In the configuration as depicted here, the layout area for the first switching transistor 31 is larger than that for the second switching transistor 32.

Figure 9:
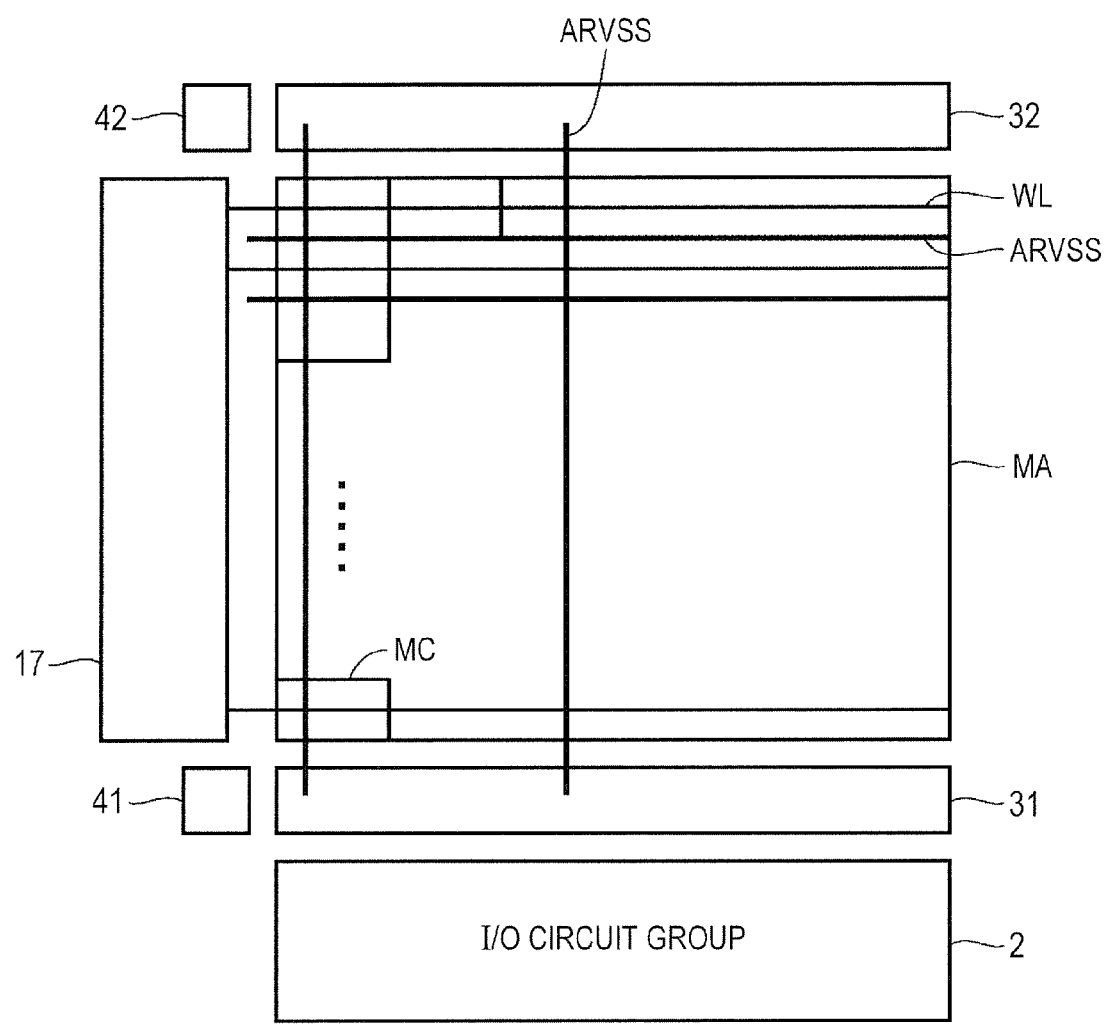
FIG. 9 is a diagram to explain where drivers 41, 42 are arranged, based on Modification Example 2 of an embodiment.

FIG. 9 is a diagram to explain where drivers 41, 42 are arranged, based on Modification Example 2 of an embodiment.

As depicted in FIG. 9, an example is illustrated in which a driver 41 is provided at one end side of each column, where a first switching transistor 31 is provided, and a driver 42 is provided at the other end side of each column, where a second switching transistor 32 is provided.

As described previously, a first switching transistor 31 is arranged at one end side of each column of memory cells and a second switching transistor 32 is arranged at the other end side of each column. A source line ARVSS is coupled to these transistors by wiring on an upper layer and further coupled to each memory cell via wiring on a lower layer which is provided for each row of memory cells. The drivers 41, 42 to drive the first and second switching transistors 31, 32 are accordingly arranged at one end side and the other end side of each column respectively, thereby making it possible to easily design a wiring layout for control signals RSB1, RSB2 to control the first and second switching transistors. If first switching transistors are arranged at both end sides of each column, signal wiring must be provided at both the end sides. However, because a first switching transistor is arranged at one end side of each column, it is possible to provide signal wiring only at the one end side.

The first switching transistor 31 is arranged between the memory cell MC and the I/O circuit group 2 and the driver 41 is arranged at one end side of each column of memory cells in the vicinity of the I/O circuit group 2. Because many signal wiring lines such as bit lines are required to couple the memory cell MC and the I/O circuit group 2, arranging the driver 41 which is an simple inverter at one end side in the vicinity of the I/O circuit group and arranging the driver 42 which controls the switching transistor 32 to be diode-coupled in standby mode at the other end side would make it possible to easily design wiring layouts.

MODIFICATION EXAMPLE 3

In the foregoing embodiments, descriptions were provided about the source line potential control circuit that properly sets the potential of a source line ARVSS which is coupled to the driving transistors NT0, NT1 of a memory cell MC. Also for a source power supply line which is coupled to a source electrode of load transistors PT0, PT1 and feeds a power supply voltage VDD, the above source line potential control circuit can be applied in a similar manner.

Figure 10:
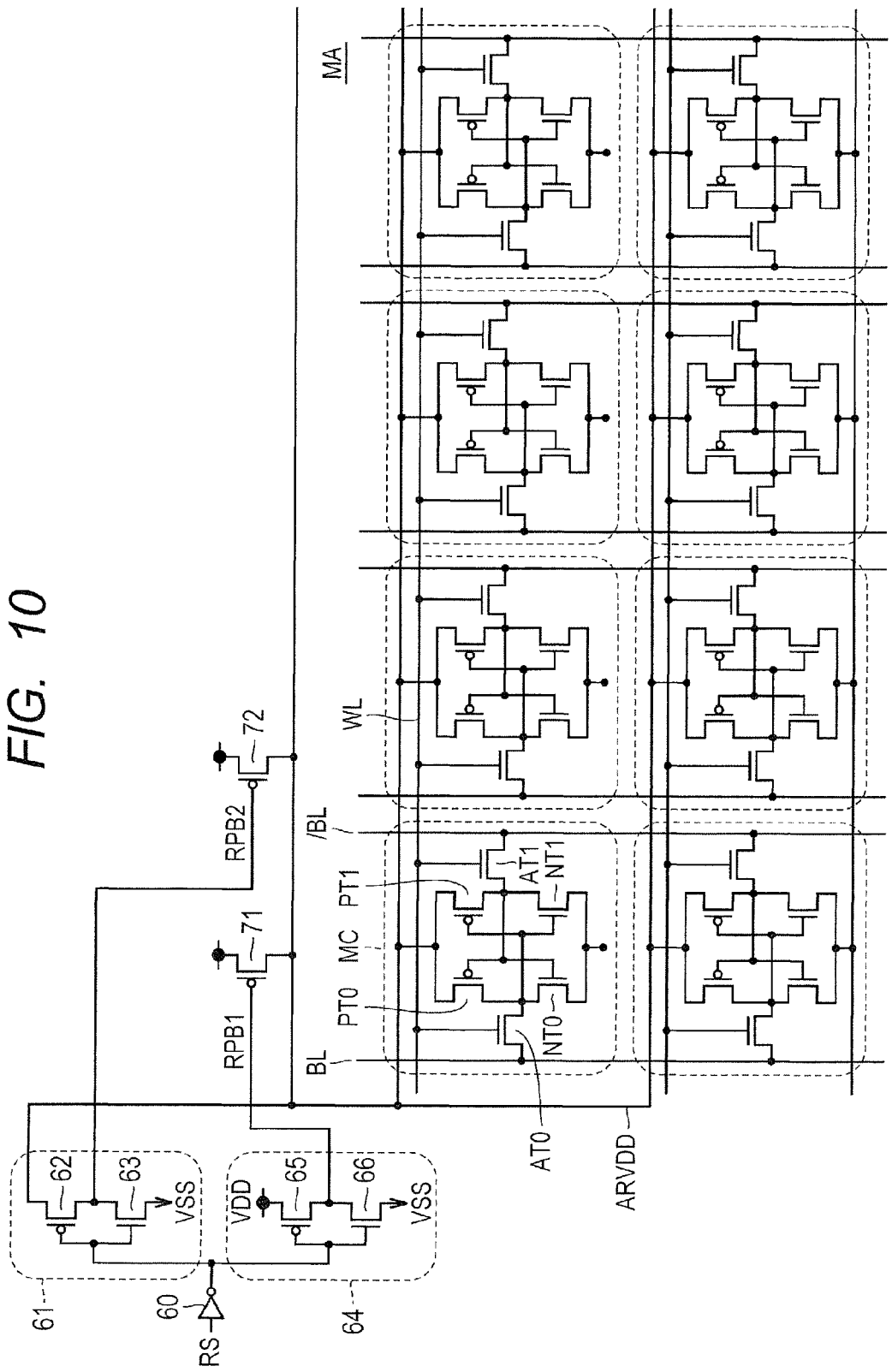
FIG. 10 is a diagram to explain a source line potential control circuit configuration based on Modification Example 3 of an embodiment.

FIG. 10 is a diagram to explain a source line potential control circuit configuration based on Modification Example 3 of an embodiment.

As depicted in FIG. 10, as the source line potential control circuit, a standby control circuit 21 further includes an inverter 60, drivers 61, 64, and first and second power supply switching transistors 71, 72.

The drivers 61, 64 are configured as an inverter. A driver 61 includes a P-channel MOS transistor 62 and an N-channel MOS transistor 63. A driver 64 includes a P-channel MOS transistor 65 and an N-channel MOS transistor 66.

The P-channel MOS transistor 65 and N-channel MOS transistor 66 are provided between a power supply voltage VDD and a ground voltage VSS and their gates receive, as an input, an inversion signal of a control signal RS via the inverter 60. And, an output of the driver 64 is input to a gate of a first power supply switching transistor 71 as a control signal RPB1.

The P-channel MOS transistor 62 and N-channel MOS transistor 63 are provided between a source power supply line ARVDD and the ground voltage VSS and their gates receive, as an input, an inversion signal of a control signal RS via the inverter 60. And, an output of the driver 61 is input to a gate of a second power supply switching transistor 72 as a control signal RPB2.

The first power supply switching transistor 71 is provided between the power supply voltage VDD and the source power supply line ARVDD and its gate receives the control signal RPB1 as an input.

The second power supply switching transistor 72 is provided between the power supply voltage VDD and the source power supply line ARVDD and its gate receives the control signal RPB2 as an input.

The control circuit & address decoder 20 sets the control signal RS at "L" level in normal mode and sets the RS signal at "H" level in standby mode.

The drivers 61, 64 set the control signals RPB1, RPB2 depending on the control signal RS. Particularly, when the control signal RS is "L" level, the N-channel MOS transistors 63 and 66 become conductive to set both the control signals RPB1, RPB2 at "L" level.

Thereby, the gates of the first and second power supply switching transistors 71, 72 are set to a potential of "L" level and, thus, the first and second power supply switching transistors 71, 72 become conductive. It follows that the source power supply line ARVDD is electrically coupled to the power supply voltage VDD.

When the control signal RS is "H" level, the P-channel MOS transistor 65 becomes conductive. Thereby, the control signal RPB1 is set at "H" level and the gate of the first power supply switching transistor 71 is set to a potential of "H" level. It follows that the source power supply line ARVDD is electrically decoupled from the power supply voltage VDD.

When the control signal RS is "H" level, the P-channel MOS transistor 62 also becomes conductive. Thereby, the gate of the second power supply switching transistor 72 is electrically coupled to the source power supply line ARVDD. It follows that the control signal RPB2 is set at the same potential level as the source power supply line ARVDD.

In this regard, the potential of the source power supply line ARVDD is balanced by a leak current from the memory cells MC and a passing current through the diode-coupled second power supply switching transistor 72 and set at an intermediate potential between the power supply voltage VDD and the ground voltage VSS. A potential difference between the power supply voltage VDD and the intermediate potential is set to a voltage higher than a voltage that allows the memory cells MC to retain data.

Because the source power supply line ARVDD based on the present embodiment is set at an intermediate potential in standby mode by the source line potential control circuit, it is possible to reduce a leak current. In this regard, the intermediate potential can easily be adjusted by adjusting the size of the second power supply switching transistor 72, such as its gate length and width and the number of switching transistors.

In normal mode, the second power supply switching transistor 72 becomes conductive and the first power supply switching transistor 71 also becomes conductive, thus bringing the potential of the source power supply line ARVDD up to the power supply voltage VDD. Because the first and the second power supply switching transistors 71 and 72 become conductive in this way, it is not necessary to increase the size of the first power supply switching transistor 71 and it is possible to reduce the area for these transistors. In standby mode, the first power supply switching transistor 71 becomes non-conductive and the second power supply switching transistor 72 only will be diode-coupled. Therefore, the source potential of the source power supply line ARVDD can be adjusted by adjusting the size of only the second power supply switching transistor 72.

The present configuration can be combined with any of other modification examples.

MODIFICATION EXAMPLE 4

In the foregoing embodiments, descriptions were provided about a method of properly setting the potential of a source line ARVSS according to a control signal RS to control operation in standby mode. Particularly, descriptions were provided about a method of setting the potential of a source line ARVSS to an intermediate potential between the power supply voltage VDD and ground voltage VSS so that the memory cells will retain data and, besides, a leak current will be reduced.

On the other hand, a case where the memory cells do not need to retain data is also conceivable in a situation of the semiconductor storage device.

In Modification Example 4 of an embodiment, descriptions are provided about a method of controlling the potential of a source line in a case where the memory cells do not need to retain data.

Figure 11:
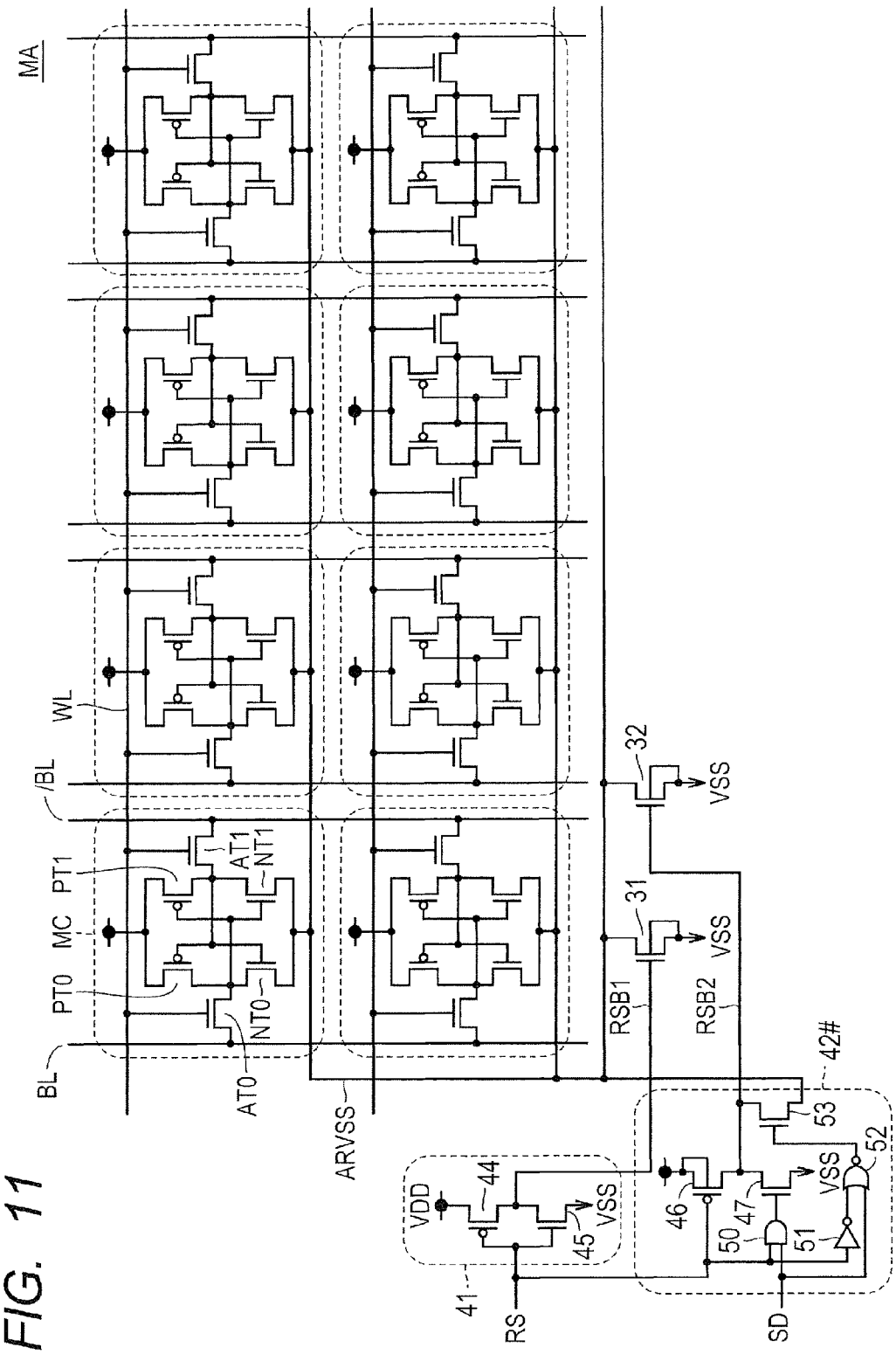
FIG. 11 is a diagram to explain a source line potential control circuit configuration based on Modification Example 4 of an embodiment.

FIG. 11 is a diagram to explain a source line potential control circuit configuration based on Modification Example 4 of an embodiment.

In comparison with the source line potential control circuit described with FIG. 3, a source line potential control circuit based on Modification Example 4 of an embodiment differs in that the driver 42 is replaced by a driver 42# and the driver 42# also receives a control signal SD as an input, as depicted in FIG. 11. Other parts of the configuration are the same as in FIG. 3; their detailed description is not repeated.

The driver 42# includes a P-channel MOS transistor 46 and an N-channel MOS transistor 47, and an AND circuit 50, an inverter 51, a NOR circuit 52, and an N-channel MOS transistor 53.

The P-channel MOS transistor 46 and the N-channel MOS transistor 47 are provided between a power supply voltage VDD and a source line ARVSS. A gate of the P-channel MOS transistor 46 receives a control signal RS as an input. A gate of the N-channel MOS transistor 47 receives an output signal of the AND circuit 50. The AND circuit 50 outputs a result of an AND logical operation on a control signal RS and a control signal SD to the gate of the N-channel MOS transistor 47.

The N-channel MOS transistor 53 is coupled between the gate of an N-channel MOS transistor 32 and the source line ARVSS. A gate of the N-channel MOS transistor 53 receives an output signal of the NOR circuit 52. The NOR circuit 52 outputs a result of a NOR logical operation on an inversion signal of the control signal RS via the inverter 51 and the control signal SD to the gate of the N-channel MOS transistor 53.

The control circuit & address decoder 20 sets the control signal RS at "L" level in normal mode and sets the RS signal at "H" level in standby mode.

Besides, the control circuit & address decoder 20 sets the control signal SD at "L" level in normal mode and sets the control signal SD at "H" level when a shutdown is performed so that the memory cells will not need to retain data.

The drivers 41, 42# set control signals RSB1, RSB2 depending on the control signal RS. Particularly, when the control signal RS is "L" level, the P-channel MOS transistors 44 and 46 become conductive to set both the control signals RSB1, RSB2 at "H" level.

Thereby, the gates of the first and second switching transistors 31, 32 are set to a potential of "H" level and, thus, the first and second switching transistors 31, 32 become conductive. It follows that the source line ARVSS is electrically coupled to the ground voltage VSS.

When the control signal RS is "H" level, the N-channel MOS transistor 45 becomes conductive. Thereby, the control signal RSB1 is set at "L" level and the gate of the first switching transistor 31 is set to a potential of "L" level. It follows that the source line ARVSS is electrically decoupled from the ground voltage VSS.

In the driver 42#, on the other hand, when the control signal RS is "H" level, operation differs depending on the state of the control signal SD.

Particularly, when the control signal RS is "H" level and the control signal SD is "L" level, the N-channel MOS transistor 53 becomes conductive. Thereby, the gate of the second switching transistor 32 is electrically coupled to the source line ARVSS. It follows that the control signal RPB2 is set at the same potential level as the source line ARVSS.

On the other hand, when the control signal RS is "H" level and the control signal SD is "H" level, the N-channel MOS transistor 47 becomes conductive. Thereby, the gate of the second switching transistor 32 is set to a potential of "L" level and this transistor is set non-conductive.

Thus, the source line ARVSS becomes open and the memory cells MC become unable to retain data.

The present configuration makes it possible to make a further reduction in power consumption by shutting off the supply of power to the source line ARVSS in a case where the memory cells do not need to retain data in a situation of the semiconductor storage device.

While the invention disclosed herein has been described specifically based on its embodiments hereinbefore, it goes without saying that the present invention is not limited to the embodiments and various modifications may be made thereto without departing from the scope of the invention.

What is claimed is:

1. A semiconductor storage device comprising:
    a memory array comprising a plurality of memory cells provided in rows and columns; and
    a control circuit for controlling the memory array,
    each of the memory cells being a static-type memory cell comprising driving transistors, transfer transistors, and load elements,
    the control circuit comprising:
        a first switching transistor provided between a source line and a first voltage, the source line being coupled to source electrodes of the driving transistors;
        a second switching transistor provided in parallel with the first switching transistor between the source line and the first voltage;
        a first driver connected between the first voltage and a second voltage to drive a gate of the first switching transistor according to a first control signal; and
        a second driver connected between the first voltage and the source line to drive a gate of the second switching transistor according to the first control signal,
    wherein the first switching transistor and the first driver are arranged at a first end side of the memory array, and
    wherein the second switching transistor and the second driver are arranged at a second end side of the memory array opposite to the first end side of the memory array.

2. The semiconductor storage device according to claim 1,
    wherein the memory array includes a plurality of memory cell columns,
    wherein the first and second switching transistors includes a plurality of pairs of the first and second switching transistors, and
    wherein the source line includes a plurality of source lines, each of which is provided for at least one memory cell column and each of which is coupled to at least one pair of the first and second switching transistors.

3. The semiconductor storage device according to claim 2,
    wherein each memory cell column includes ones of the memory cells arranged in a column direction and has a first end side and a second end side,
    wherein each of the plurality of source lines is arranged between the first end side and the second end side of the corresponding memory cell column and arranged along the corresponding memory cell column,
    wherein the first switching transistor is coupled to the corresponding source line at the first end side of the corresponding memory cell column, and
    wherein the second switching transistor is coupled to the corresponding source line at the second end side of the corresponding memory cell column.

4. The semiconductor storage device according to claim 1, wherein the second driver drives the second switching transistor depending on a combination of the first control signal and a second control signal.

5. The semiconductor storage device according to claim 4,
    wherein the second driver controls that the second switching transistors are in the non-conductive state based on the second control signal.

6. The semiconductor storage device according to claim 1, wherein the first switching transistor is larger than the second switching transistor.

7. The semiconductor storage device according to claim 1, further comprising an I/O circuit for reading data from or writing data to the memory array,
    wherein the first switching transistor is arranged between the memory array and the I/O circuit.

8. The semiconductor storage device according to claim 1,
    wherein, when the memory cells are in an operating mode, the source line potential control circuit controls the first and second switching transistors so that both the first and second switching transistors are in a conductive state to couple the source line to the first voltage, and
    wherein, when the memory cells are in a standby mode, the source line potential control circuit controls the first and second switching transistors so that the first switching transistor is in a non-conductive state and the second switching transistor is in a diode connection state by coupling a gate electrode of the second switching transistor to the source line.

* * * * *